United States Patent [19]

Hsu

[11] Patent Number: 5,138,192
[45] Date of Patent: Aug. 11, 1992

[54] AC VOLTAGE IDENTIFICATION CIRCUIT

[75] Inventor: Shih-Yen Hsu, Hsinchu, Taiwan

[73] Assignee: Accton Technology Corporation, Hsinchu, Taiwan

[21] Appl. No.: 602,782

[22] Filed: Oct. 24, 1990

[51] Int. Cl.⁵ .................. H03K 5/153; H03K 5/08; H03K 5/00; H02M 7/04
[52] U.S. Cl. .................. 307/350; 307/564; 307/261; 328/26; 363/143
[58] Field of Search ............... 363/143; 307/350, 358, 307/540, 544, 566, 560, 564, 261; 328/262, 26

[56] References Cited

U.S. PATENT DOCUMENTS

| 3,787,755 | 1/1974 | Goldner | 328/26 |
| 3,900,787 | 8/1975 | Köster | 363/143 |
| 4,658,345 | 4/1987 | Ingman | 363/143 |
| 4,864,488 | 9/1989 | Bulmahn et al. | 363/143 |

FOREIGN PATENT DOCUMENTS

| 0212370 | 12/1983 | Japan | 363/143 |
| 0067873 | 4/1984 | Japan | 363/143 |

Primary Examiner—Eugene R. LaRoche
Assistant Examiner—Evelyn A. Lester
Attorney, Agent, or Firm—Bacon & Thomas

[57] ABSTRACT

An AC voltage identification circuitry includes a rectifying circuit, a sensor circuit, a discharge circuit, a storage circuit and a clamping element. The identification circuit is connected to an AC circuit for identifying the magnitude of the AC voltage. The AC current is rectified and a capacitor in a storage circuit is charged through a resistor. The height of the voltage is sensed by means of resistors in the sensor circuit. As the sensor circuit senses a higher voltage, it causes a transistor in the discharge circuit to discharge the capacitor in the storage circuit rapidly to a near zero voltage through its resistor. If the input is a low voltage signal, the transistor on the discharge circuit cannot cause the capacitor on the storage circuit to discharge, and the capacitor is thus charged to a relatively higher voltage. Its maximum voltage is then clamped by the voltage clamping circuit. The height of the voltage in the capacitor on the storage circuit identifies the height of the input AC voltage.

5 Claims, 3 Drawing Sheets

AC VOLTAGE IDENTIFICATION CIRCUIT

TECHNICAL FIELD

This invention relates to a voltage identification circuit for identifying a range of input voltage. Its output can drive a solid electronic switch or relay, and preset automatically the range of applicable voltage.

BACKGROUND ART

There are many kinds of AC voltage sources. AC voltage sources of 110 and 220 volts are the most commonly used type of voltage sources. To permit use with the different voltage sources, electric household appliances should accommodate different AC voltages. In general, a preset switch is installed on the power supply for this purpose. In order to accommodate the different voltages in various areas, the makers of appliances have previously been required to manually preset the switch in an appropriate position, because if the switch is wrongly preset, damage to the appliances will result. Appliances damaged in this manner cannot be reused, and the consequential damage resulting from such a mistake can be disastrous. To solve this problem, a device which not only can automatically sense an AC input voltage and also automatically preset the voltage preset switch to an appropriate position, is desired by the people.

A commonly used AC voltage sensor circuit is shown in FIG. 1. It consists of a transformer 101, a rectifier 102, a filter 103, a voltage stabilizer 104 and an operational amplifier 110 which acts as a comparator. The comparator circuit (operational amplifier 110) should be operated at a DC voltage of less than 30 volts and, consequently, the voltage of the input AC power must first be changed by transformer 101, then rectified by rectifier diode 102 and filtered by a filter capacitor to provide the necessary DC power. The voltage stabilizer 104 produces stabilized DC power. The stabilized DC power can be used as operational power for the operational amplifier 110. On the other hand, the DC power is also divided by the resistors 108 and 109 to function as reference voltages. Capacitor 106 is used as a filter and voltage stabilizer. The voltage on the filter capacitor 103 is changed according to the input AC voltage. After it is divided by resistors 106 and 107, and compared with a reference voltage, by means of the output voltage of the operational amplifier 110, the input AC voltage can be identified. Since this device requires a transformer, DC stabilizer, and operational amplifier, the total weight and the cost are very high.

SUMMARY OF THE INVENTION

The defects of the AC voltage sensor circuit as shown in FIG. 1 were carefully investigated and it was found that:

1) the voltage identification circuit should be operated at a DC voltage of greater than 100 volts, in which case the low frequency transformer would not be needed, thereby lightening the total weight and reducing the circuit's size to fit within a compact shape, and
2) the voltage identification circuit should not use a reference voltage produced from the stabilized power as the standard of identification. As a result, the manufacturing cost can be lowered considerably.

In view of these discoveries, the inventor has found not only a new method of identifying the voltage, but also one which fulfills requirements (1) and (2), listed above, by controlling the voltage produced by cyclic charging and discharging of a capacitor.

Accordingly, an object of the present invention is to provide an AC voltage identification circuit which can be operated above a DC voltage of 100 volts without the need for a low frequency transformer, thereby lightening the total weight and size of the circuit components.

In addition, the AC voltage identification circuit of the invention does not depend upon a reference voltage as its standard of sensing, but rather can identify the input AC voltage by means of the status of voltage produced by controlling the charging and discharging of the capacitors. Therefore, the manufacturing cost of this device is much lower than that of traditional devices. Lowering of costs by eliminating dependence on the reference voltage is another object of the invention.

A more complete understanding of these and other features and advantages of the present invention will be given in the following detailed description of certain embodiments illustrated in the accompanying drawings.

DETAILED DESCRIPTION OF PREFERRED EMBODIMENTS

Figure 1:
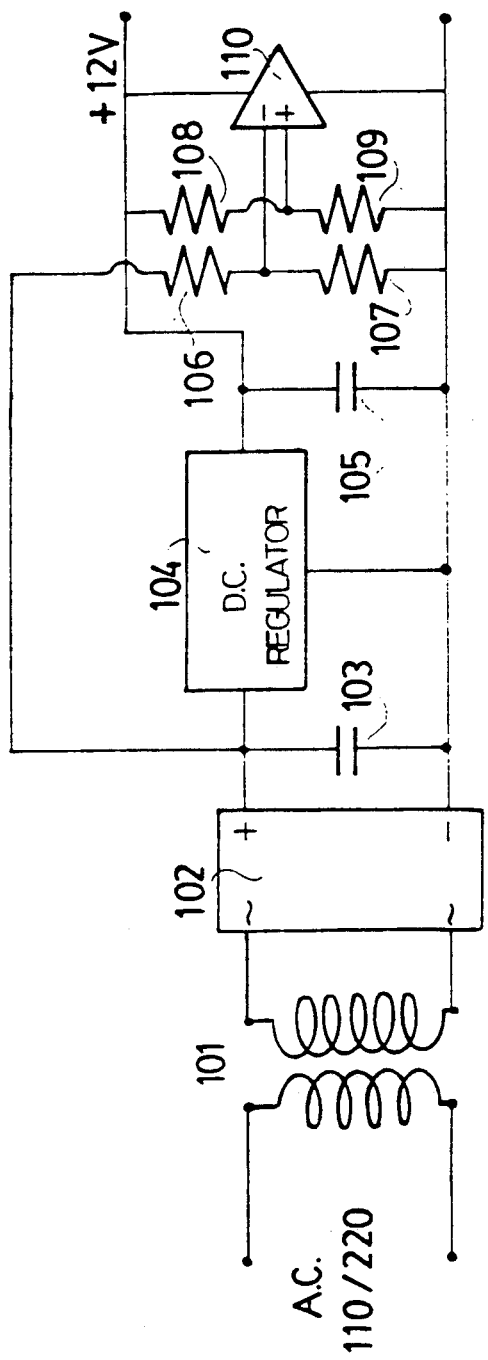
FIG. 1 shows the conventional AC voltage sensor circuit.

FIG. 1 is a conventional AC voltage identification circuit, the defects of which have been already described and need not be repeated.

Figure 2A:
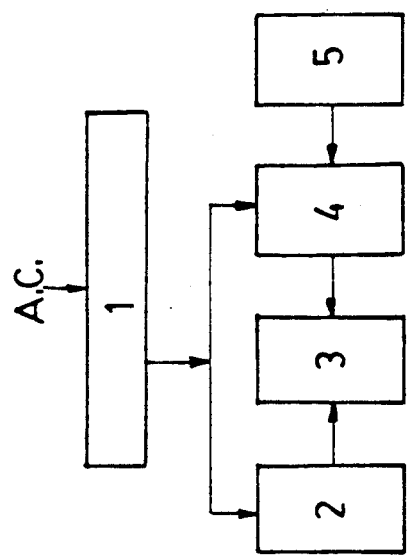
FIG. 2A is a block diagram of on practical example of this invention.

Referring to FIG. 2A, the AC voltage identification circuit of a preferred embodiment of the invention includes a rectifying circuit 1 which rectifies an input AC voltage into an unfiltered DC voltage, then feeds the DC voltage to a sensor circuit 2 which senses the level of the rectified input voltage and to a storage circuit 4. A discharge circuit 3 reacts to the output of circuit 2 to control the discharge path, and a voltage clamp circuit 5 clamps the DC output voltage at an appropriate value.

Figure 2B:
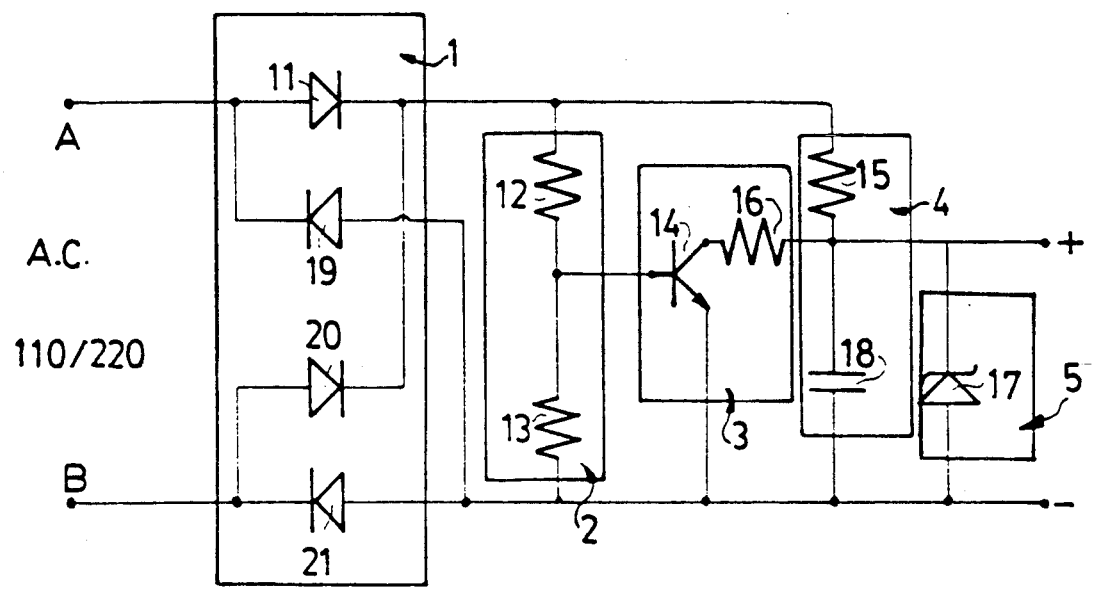
FIG. 2B shows a practical circuit of this invention.

As shown in FIG. 2B, the rectifying circuit 1 includes diodes 11, 19, 20 and 21 connected to ends A and B of the power input. The sensor circuit 2 includes a pair of series connected resistors 12 and 13, and both ends of the sensor circuit are connected with the two output ends of rectifying circuit 1, the node between the resistors 12 and 13 being connected with discharge circuit 3. The discharge circuit includes transistor 14 and resistor 16. The storage circuit 4 is an RC storage circuit which includes resistor 15 and capacitor 18. The voltage clamping circuit 5 is a Zener diode 17.

In operation, AC power is supplied through input ends A and B and rectified by diodes 11, 19 20 and 21, thereby cyclically charging the capacitor 18 through resistor 15. The voltage on capacitor 18 is the output voltage of this circuit. This rectified but not filtered voltage is also applied through resistors 12 and 13. The two resistors act as voltage dividers for sensing the height of input voltages. When the input voltage is low, transistor 14 does not receive a threshold base voltage, and thus remains in a non-conductive state. As a result, the voltage on capacitor 18 rises for each cycle by charging until Zener Diode 17 is switched on.

Figure 3:
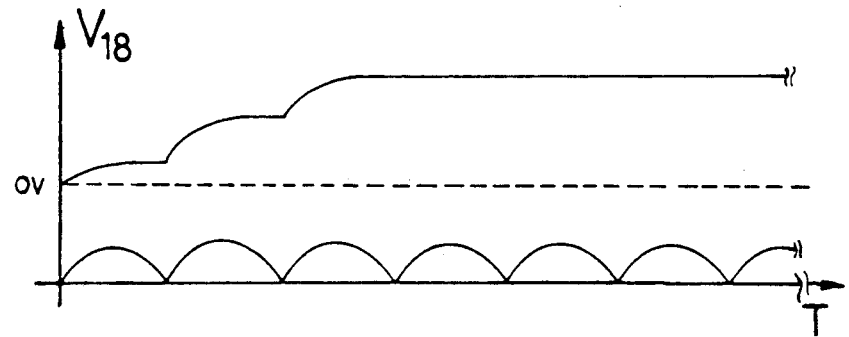
FIG. 3 is a comparative diagram for output voltage of identification circuit against time when input AC voltage is low.
Figure 4:
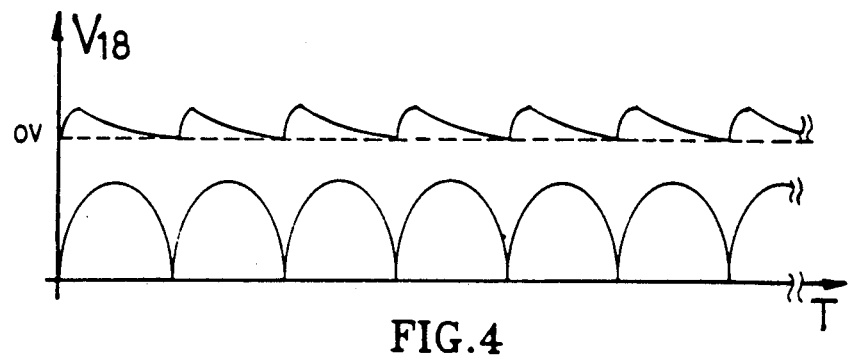
FIG. 4 is a comparative diagram for output voltage of identification circuit against time when input AC voltage is high.
Figure 5:
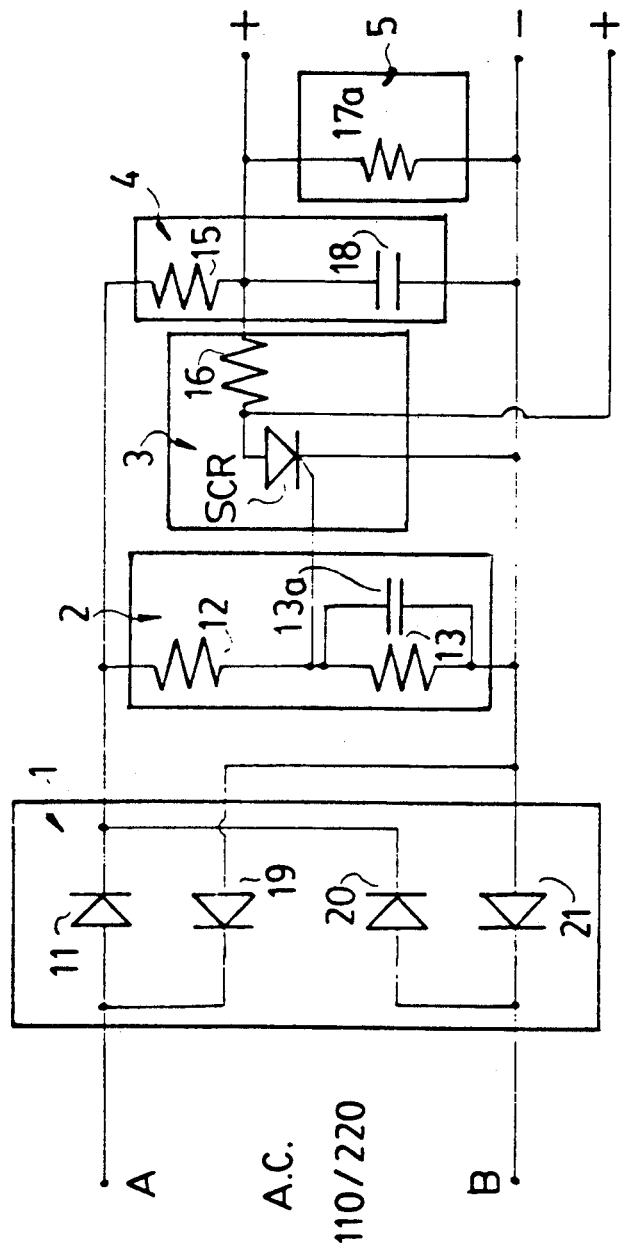

FIG. 3 shows the relationship between the rectified input and the output voltage and time for this embodiment. When the input voltage level is high, e.g. 200 volts, the discharge transistor 14 receives a sufficiently high base voltage to switch on. For instance, if the input voltage is 110 or 220 volts, and 150 volts after division is preset as the threshold base voltage of transistor 14, then the transistor 14 becomes conductive at 150 volts for a portion of each cycle, at which time capacitor 18 discharges rapidly to a condition of nearly zero voltage through resistor 16 and transistor 14. Therefore, the output voltage can be maintained at nearly zero voltage. FIG. 4 shows the relationship between the rectified input and the output voltage against time in this circuit.

In order to maintain the output voltage in the condition of a voltage close to zero volts when the input voltage is high, it is necessary to select a suitable ratio between the charging time constant and the discharge time constant. For example, the charging time constant can be selected to be approximately 100 ms. The discharging time constant is preferably 1/500 of the charging time, or 0.2 ms. The practical component values necessary to achieve these ratios may be fixed according to the application in which the circuit will be used.

The above-described circuit, which illustrates the principles of the invention, therefore identifies the level of an AC voltage without requiring a low frequency transformer, thereby reducing the total weight and minimizing the size of the circuit. The cycle by cycle charging and discharging method makes this invention relatively simple. Those skilled in the art will appreciate that it has an inherent power-on delay and noise immunity due to the storage circuit used. The advantages provided by this invention are significant in comparison with the conventional arrangement.

Although the present invention has been described with a certain degree of particularity, the present disclosure has been made by way of example and changes in detail of structure may be made without departing from the spirit thereof.

I claim:

1. An AC voltage identification circuit for connection to an AC circuit in order to sense an AC voltage in the AC circuit, comprising:
   a rectifying circuit including rectifying means for rectifying the AC current into a DC current;
   a storage circuit connected to the rectifying circuit and including storage means for storing the DC current;
   a sensor circuit including voltage divider means for sensing the voltage of said DC current;
   a discharge circuit connected to the sensor circuit for causing the storage circuit to discharge in response to a transmittal condition determined by the sensed voltage; and
   a voltage clamping circuit for clamping a voltage on the storage device at a level dependent on said sensed voltage,
   wherein said storage means is caused to be cyclically charged and discharged and the voltage on the storage means is determined by the transmittal condition of said discharge means.

2. An AC voltage identification circuit as claimed in claim 1, wherein the rectifier is a diode rectifier and the voltage clamping circuit comprises a zener diode.

3. An AC voltage identification circuit as claimed in claim 1, wherein the storage circuit comprises at least one resistor and one capacitor, the resistor being arranged to control a rate of charge of the capacitor.

4. An AC voltage identification circuit as claimed in claim 3, wherein the sensor circuit comprises a voltage divider including at least two resistors, an output of said voltage divider being connected to an input of said discharge circuit.

5. An AC voltage identification circuit as claimed in claim 3, wherein said discharge circuit comprises a transistor and a current limited resistor connected in series and then connected in parallel with two ends of the capacitor in the storage circuit.

* * * * *